(12) United States Patent
Zhu

(10) Patent No.: US 8,541,305 B2
(45) Date of Patent: Sep. 24, 2013

(54) 3D INTEGRATED CIRCUIT AND METHOD OF MANUFACTURING THE SAME

(75) Inventor: Huilong Zhu, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 367 days.

(21) Appl. No.: 13/003,744

(22) PCT Filed: Sep. 19, 2010

(86) PCT No.: PCT/CN2010/001435
§ 371 (c)(1),
(2), (4) Date: Jan. 11, 2011

(87) PCT Pub. No.: WO2011/147061
PCT Pub. Date: Dec. 1, 2011

(65) Prior Publication Data
US 2011/0284992 A1    Nov. 24, 2011

(30) Foreign Application Priority Data
May 24, 2010   (CN) .......................... 2010 1 0189140

(51) Int. Cl.
*H01L 23/48*    (2006.01)
*H01L 21/44*    (2006.01)
*H01L 21/322*   (2006.01)

(52) U.S. Cl.
USPC ........... 438/667; 438/471; 438/473; 257/751; 257/913

(58) Field of Classification Search
USPC .................. 438/471, 474, 667; 257/E21.597
See application file for complete search history.

(56) References Cited

U.S. PATENT DOCUMENTS

| 4,053,335 A | * | 10/1977 | Hu ................................ 438/143 |
| 4,589,928 A | * | 5/1986 | Dalton et al. .................. 438/143 |
| 5,162,241 A | * | 11/1992 | Mori et al. ..................... 438/402 |
| 5,223,734 A | * | 6/1993 | Lowrey et al. ................. 257/401 |
| 5,360,748 A | * | 11/1994 | Nadahara et al. ............. 438/476 |
| 5,894,037 A | * | 4/1999 | Kikuchi et al. ............. 427/372.2 |

(Continued)

FOREIGN PATENT DOCUMENTS

| CN | 1533603 A | 9/2004 |
| CN | 1595625 A | 3/2005 |

(Continued)

OTHER PUBLICATIONS

First Office Action issued by the Chinese State Intellectual Property Office dated Jun. 5, 2012, in Application No. 201010189140.X.

(Continued)

*Primary Examiner* — Chuong A Luu
*Assistant Examiner* — Cory Eskridge
(74) *Attorney, Agent, or Firm* — Kinney & Lange, P.A.

(57) ABSTRACT

The present invention provides a 3D integrated circuit and a manufacturing method thereof. The circuit structure comprises: a semiconductor substrate; at least one semiconductor device formed on the upper surface of the semiconductor substrate; a through-Si-via through the semiconductor substrate and comprising an insulating layer covering sidewalls of the through-Si-via and conductive material filled in the insulating layer; an interconnection structure connecting the at least one semiconductor device and the through-Si-via; and a diffusion trapping region formed on the lower surface of the semiconductor substrate. The present invention is applicable in manufacture of the 3D integrated circuit.

20 Claims, 5 Drawing Sheets

(56) References Cited

U.S. PATENT DOCUMENTS

| | | | |
|---|---|---|---|
| 7,029,937 B2 * | 4/2006 | Miyazawa | 438/40 |
| 7,737,004 B2 * | 6/2010 | Lysacek et al. | 438/476 |
| 8,329,563 B2 * | 12/2012 | Minato et al. | 438/471 |
| 2008/0116447 A1 * | 5/2008 | Lojek | 257/24 |
| 2010/0032808 A1 * | 2/2010 | Ding et al. | 257/621 |
| 2011/0049717 A1 * | 3/2011 | West | 257/751 |
| 2011/0187000 A1 * | 8/2011 | West | 257/751 |

FOREIGN PATENT DOCUMENTS

| | | |
|---|---|---|
| CN | 1595625 A | 3/2006 |
| CN | 101330025 A | 12/2008 |
| JP | 2008244363 A | 10/2008 |

OTHER PUBLICATIONS

International Search Report and Written Opinion in foreign counterpart Application No. PCT/CN2010/001435, dated Mar. 10, 2011.

* cited by examiner

3D INTEGRATED CIRCUIT AND METHOD OF MANUFACTURING THE SAME

BACKGROUND OF THE INVENTION

1. Field of the Invention

The invention relates to the field of integrated circuit manufacturing, and more particularly, to an integrated circuit having a diffusion trapping layer and a method of manufacturing the same.

2. Description of the Prior Art

In the process of manufacturing an integrated circuit, it is very likely for metal ions such as Cu, Fe, or Na ions from structures such as through-Si-via (TSV), interconnection structure, or metal electrode of semiconductor device, to diffuse into transistor structures and interconnection structures, causing performance degradation or even fault of the integrated circuit.

The metal ions may be trapped by means of directly implanting ions into the integrated circuit structure. However, the implanted ions may enter regions other than the target regions. Particularly, the dielectric layers and the through-Si-vias in the integrated circuit will probably be damaged.

SUMMARY OF THE INVENTION

To solve the above problems, one aspect of the present invention provides a 3D integrated circuit structure, comprising: a semiconductor substrate; at least one semiconductor device formed on the upper surface of the semiconductor substrate; a through-Si-via extending through the semiconductor substrate, and comprising a conductive via and an insulating layer covering sidewalls of the conductive via; an interconnection structure connecting the at least one semiconductor device and the through-Si-via; and a diffusion trapping region formed on the lower surface of the semiconductor substrate and surrounding the through-Si-via.

Preferably, the diffusion trapping region comprises any one or more ions of Ar, Xe, Ge, and P, or other ions capable of trapping metal ions. The implantation depth of the ions is in the range of about 10-1000 nm. The implantation dose of the ions is in the range of about $10^{13}$-$10^{16}$/cm$^2$.

The diffusion trapping region may be a trapping region for metal ions mainly to trap metal ions of Cu, Fe, and Na in the semiconductor structure.

For an embodiment of the present invention, the ion trapping region is formed by self-aligning the outer periphery of the through-Si-via.

Another aspect of the present invention provides a manufacturing method of an integrated circuit having a diffusion trapping layer, comprising: providing a semiconductor substrate comprising at least one semiconductor device formed on the upper surface of the semiconductor substrate; forming a through-Si-via in the semiconductor substrate, wherein the through-Si-via comprises a conductive via and an insulating layer covering sidewalls of the conductive via; forming an interconnection structure connecting the at least one semiconductor device and the through-Si-via; and selectively etching the lower surface of the semiconductor substrate to stop at the insulating layer of the through-Si-via; forming a diffusion trapping region on the lower surface; and removing a part of the through-Si-via higher than the lower surface.

Preferably, in order to protect a surface of the diffusion trapping layer, the method further comprises depositing a protection layer on the lower surface after forming the diffusion trapping region, and selectively removing the protection layer at the same time when removing the part of the through-Si-via higher than the lower surface.

Preferably, forming the diffusion trapping region may comprise implanting ions into the lower surface. The implanted ions comprise any one or more of Ar, Xe, Ge, or P. The implantation depth is controlled to be 10-1000 nm. The implantation dose is $10^{13}$-$10^{16}$/cm$^2$.

In order to obtain an optimum thickness, the method further comprises polishing the lower surface of the semiconductor substrate before selectively etching the lower surface.

For semiconductor devices made on silicon on insulator (SOI), bulk Si, or other semiconductor substrate, the diffusion trapping layer for preventing diffusion of the metal ions manufactured by the self-align technology provided by the embodiments of the present invention avoids damages induced to the dielectric layer and the through-Si-via by ion implantation.

BRIEF DESCRIPTION OF THE DRAWINGS

The above and other objects, characteristic, and advantages of the present invention will become apparent from the following description about the embodiments of the present invention in connection with the drawings, wherein.

DETAILED DESCRIPTION OF THE PREFERRED EMBODIMENTS

Figure 1:
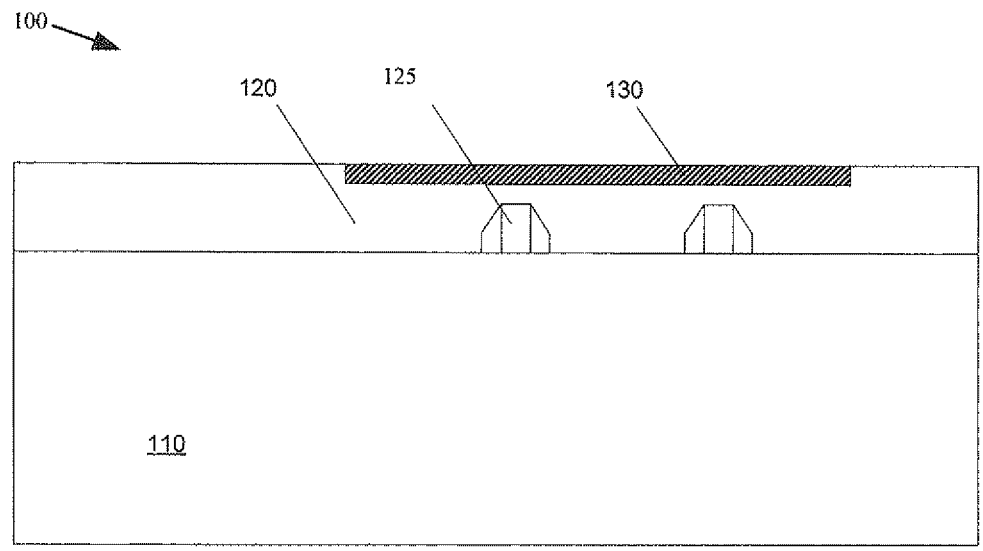
FIGS. 1-10 show sectional views of the integrated circuit structure in each step of the process of manufacturing the 3D integrated circuit according to embodiments of the present invention.

The following disclosure provides many different embodiments or examples to implement the technical solutions provided by the present invention. The following description describes components and arrangements of specific examples, but they are only exemplary, and are not intended to limit the present invention.

Further, reference numerals and/or characters may be repeatedly used in various embodiments of the present invention. Such repetitions are for simplicity and clarity purpose, and do not indicate relationships among various embodiments and/or arrangements being discussed.

The present invention provides examples about various specific process and/or materials, but those skilled in the art may conceive other process and/or other materials for substitution. It is obvious that such substitution will not depart from the scope of the present invention. It should be noted that edges of the regions described herein comprises necessary expansions as required by the process.

FIGS. 1-10 show sectional views of the integrated circuit structure in each step of the manufacture process according to embodiments of the present invention. Next, each step according to the embodiments of the present invention and the 3D integrated circuit obtained thereby will be explained in detail with reference to the drawings.

First, as shown in FIG. 1, a semiconductor wafer 100 is provided, on which parts of the process has been accomplished. The said parts of the process comprise manufacturing semiconductor devices and performing corresponding Back End of Line (BEOL) process. The semiconductor wafer 100 comprises: a semiconductor substrate 110 (e.g. a Si substrate); and a semiconductor device 125 and a corresponding BEOL structure 130 of the semiconductor device 125 on the upper surface of the semiconductor substrate 110. The semiconductor device 125 may be a MOSFET transistor. The connection between the BEOL structure 130 and the semiconductor 125 is not explicitly shown, but it should be understood that they are connected as necessary. In FIG. 1 the layer 120 is an interlayer dielectric layer electrically isolating the devices. The interlayer dielectric layer 120 insulates the BEOL structures 130.

The upper surface shown in FIG. 1 is referred to as the upper surface of the semiconductor wafer 100 for convenience. The lower surface in FIG. 1 is referred to as the lower surface or bottom of the semiconductor wafer 100. The lower surface is still referred to as the lower surface after grinding to be thinned. A portion of the through-Si-via near the lower surface is referred to as the bottom of the through-Si-via. These terminologies will not be changed whether the semiconductor wafer 100 is flipped over or not in the later process.

The specific process for forming the semiconductor wafer 100 is a common semiconductor manufacture technology, and will not be explained in detail.

Figure 2:
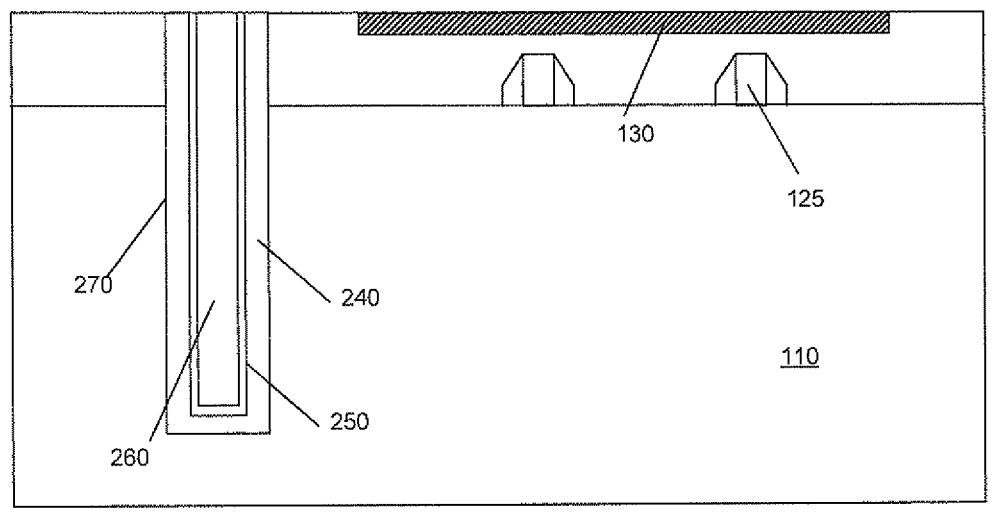

As shown in FIG. 2, a through-Si-via is formed in the semiconductor structure 100.

Steps for forming the through-Si-via may be as follows. First, as shown in FIG. 2, a hole 270 is formed in a manner extending through a part of the semiconductor substrate 100 and the interlayer dielectric layer 120. The hole 270 may be formed by dry etching such as reactive ion etching. Then an insulating layer 240 is formed on the sidewalls and the bottom of the hole 270. The material of the insulating layer 240 may be insulating materials such as oxides or nitrides. Then a liner 250 is deposited on the bottom and sidewalls of the insulating layer 240. The material of the liner 250 may be any one of Ru, Ta, TaN, Ti, TiN, TaSiN, TiSiN, TiW, and WN, or any combination thereof, or other materials. Then a conductive via 260 made of conductive materials, such as any one of Cu, Al, and W, or any combination thereof, or a conductive polymer or metal silicide, is deposited within the hole 270, in order to form the through-Si-via for 3D integrated circuit wafer interconnection. In an embodiment of the present invention, the conductive via 260 is a metal material. The insulating layer, the liner, and the metal material deposited within the hole 270 are planarized, for example, by chemical mechanical polish (CMP), to form the through-Si-via. The through-Si-via may be formed by any appropriate existing process, and the detailed explanation thereof is omitted.

Figure 3:
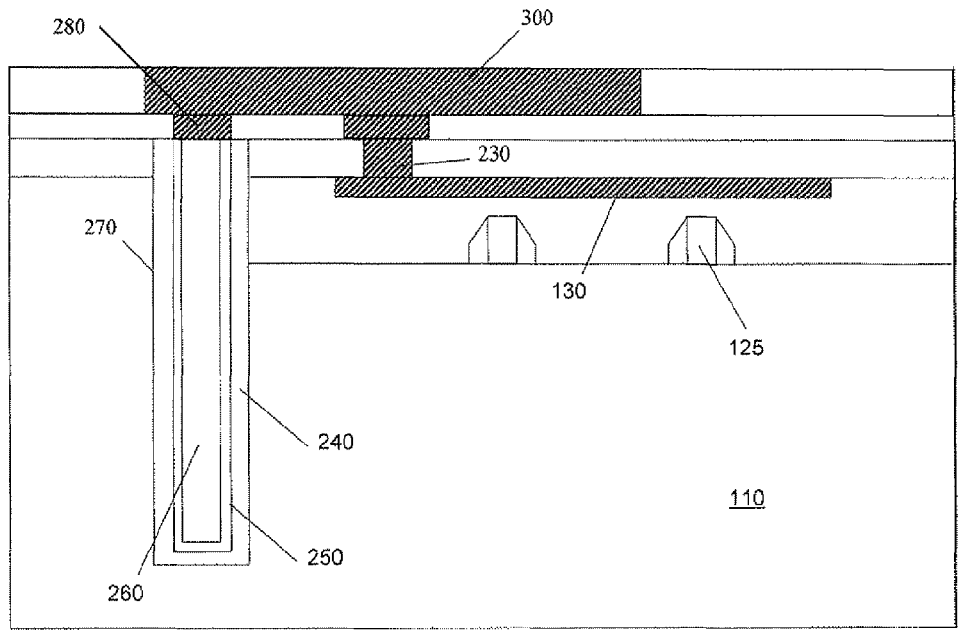

FIG. 3 shows a schematic view of the interconnection connecting the semiconductor device 125 and the through-Si-via. The interconnection structure comprises a via 280 formed on the through-Si-via and communicating therewith, a via 230 formed on the BEOL structure 130 corresponding to the semiconductor device 125, and a interconnection metal line 300 connecting the via 280 and the via 230. Thus the semiconductor device 125 and the through-Si-via may be connected by the above interconnection structure. The above interconnection structure is also encompassed among the interlayer dielectric layers. These processes are well known to those skilled in the art. As such, the 3D integrated circuit structure may be implemented by further connecting the interconnection structure of the semiconductor wafer with corresponding interconnection structures of other semiconductor wafers.

Next, a method for manufacturing the diffusion trapping layer on the semiconductor wafer shown in FIG. 3 according to an embodiment of the present invention will be described with reference to FIGS. 4-8.

In order to form the 3D integrated circuit by connecting the semiconductor wafer shown in FIG. 3 with other wafers, to supply power to the formed 3D integrated circuit, or to perform input/output of the external signals, the corresponding bottom of the wafer should be thinned to expose the metal material within the through-Si-via for corresponding electrical connections.

Figure 4:
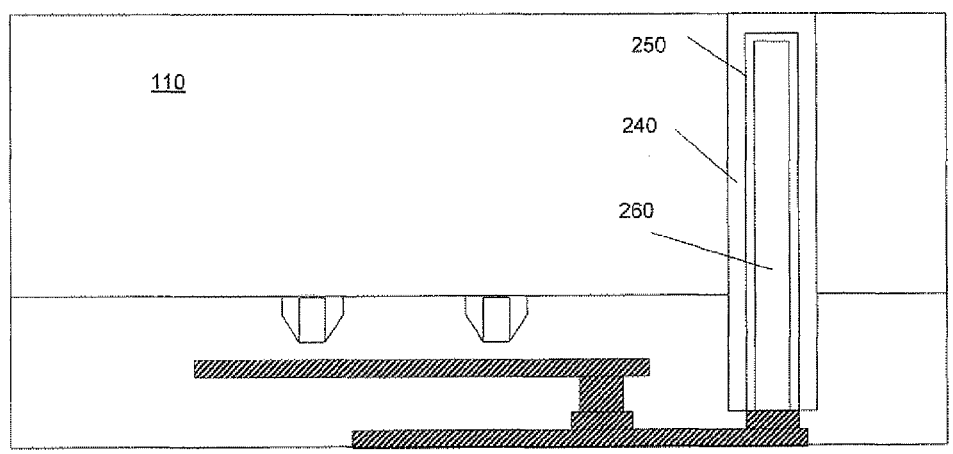

As shown in FIG. 4, the semiconductor wafer 100 is flipped over and the lower surface (bottom) of the semiconductor substrate is grinded to be thinned until the bottom surface of the insulating layer 240 is exposed.

Figure 5:
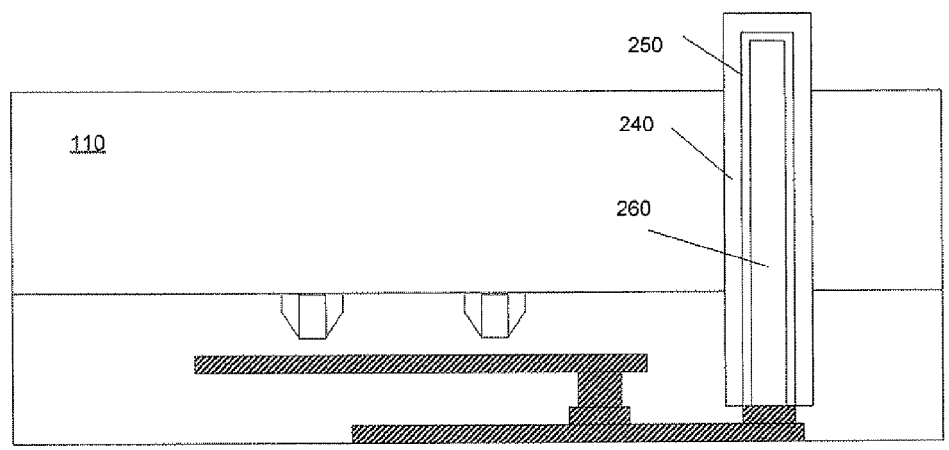

Then, as shown in FIG. 5, the lower surface of the semiconductor substrate is selectively etched for example by reactive ion etching (RIE). The etching stops at the insulating layer 240 of the through-Si-via. As shown in FIG. 5, the result of the etching is that the through-Si-via is higher than the lower surface of the semiconductor substrate.

Then the process for forming the diffusion trapping region by self-alignment according to an embodiment of the present invention is described.

Figure 6:
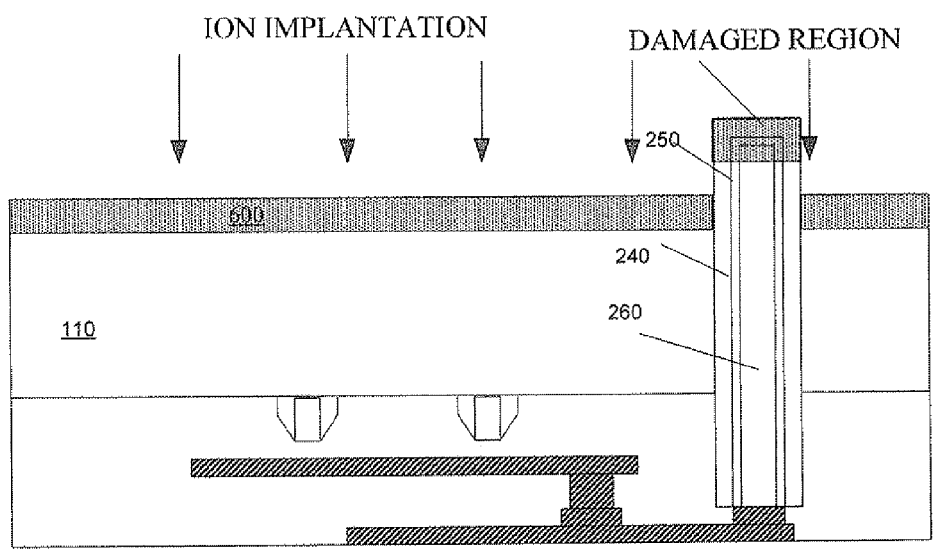

Next, as shown in FIG. 6, ion implantation is performed to the lower surface of the semiconductor substrate. The implanted ions may comprise any one or more of Ar, Xe, Ge, and P, or other ions capable of trapping metal ions. The depth of the implantation is preferable to be in the range of 10-1000 nm, and the implantation dose is preferable to be in the range of $10^{13}$-$10^{16}$/cm$^2$. Thus the diffusion trapping layer 600 is formed. The diffusion trapping layer 600 may well absorb the metal ions diffusing from the through-Si-via, the interconnection structure, or other structures, to avoid the ions from diffusing to other parts of the integrated circuit and causing negative effects of the performance or even failure to the device. As shown in FIG. 6, the implanted ions damage the bottom of the exposed through-Si-via, and therefore this part should be removed.

Figure 7:
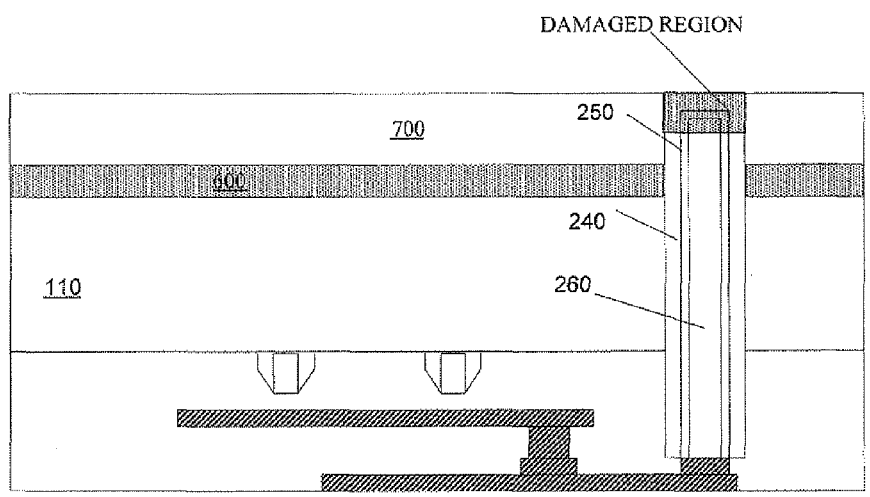

Then, as shown in FIG. 7, a protection layer 700 is deposited on the lower surface of the semiconductor substrate 110. The protection layer may be an oxide layer or a nitride layer. Preferably, the upper surface of the protection layer 700 is flushed with the bottom surface of the insulating layer 240.

Figure 8:
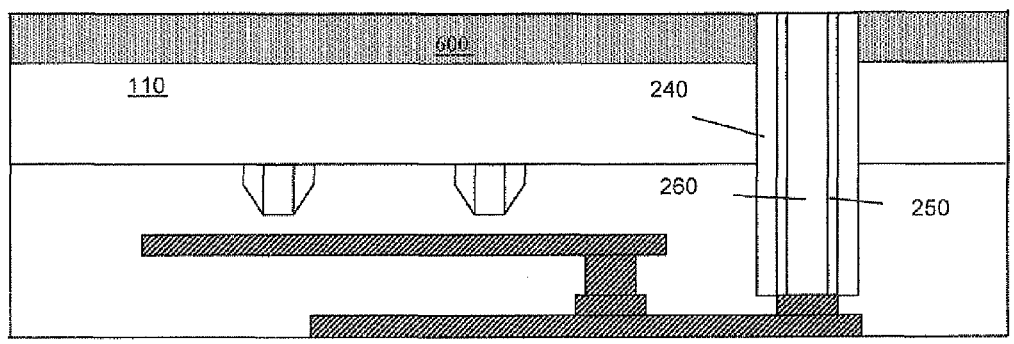

Next, as shown in FIG. 8, the protection layer 700 and the through-Si-via are polished by chemical mechanical polishing (CMP), to remove the part of the through-Si-via exposed outside of the semiconductor substrate 110. The part of the through-Si-via damaged by the ion implantation is removed by this process, and the resistance of the through-Si-via is reduced. Further, the damaged insulating layer is removed, and thus the remained insulating layer is more reliable. Therefore, the embodiment of the present invention forms the diffusion trapping layer by self-aligning the outer periphery of the through-Si-via and then removing the damaged bottom of the through-Si-via. Such a method is simple and achieves a good alignment.

In the formed 3D integrated circuit, the metal ions within the through-Si-via in the bottom of the semiconductor substrate or the metal ions in other parts of the whole 3D structure will diffuse into the semiconductor wafer easily. The diffusion trapping layer 600 of the present invention blocks the metal ions from entering the semiconductor substrate, the semiconductor device, or other structures. Therefore, the reliability of the 3D integrated circuit is increased and the damage rate is reduced.

Figure 9:
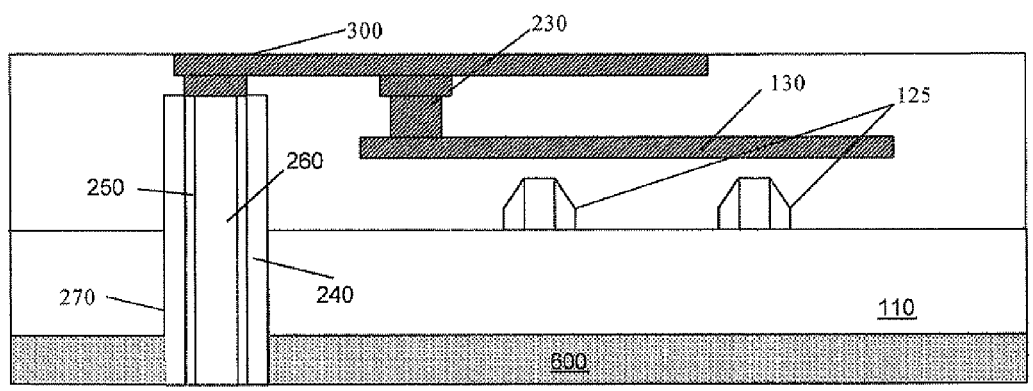

Thus, the 3D integrated circuit according to another embodiment of the present invention is obtained. As shown in FIG. 9, the integrated circuit structure comprises a semiconductor substrate 110, a semiconductor device 125 formed on the upper surface of the semiconductor substrate 110, a through-Si-via penetrating through the semiconductor substrate 110 and comprising an insulating layer 240 covering the sidewalls thereof and a conductive via 260 filled within the space surrounded by the insulating layer 240, an interconnection structure 300 connecting the semiconductor device 125 and the through-Si-via, and a diffusion trapping region 600 formed on the lower surface of the semiconductor substrate.

The semiconductor device 125 may be a MOSFET. A BEOL structure 130 is formed on the semiconductor device 125. The through-Si-via and the semiconductor device 125 are interconnected by the BEOL structure 130.

Preferably, the through-Si-via may comprise a hole 270, an insulating layer 240 covering the bottom and sidewalls of the hole 270, a liner 250 covering the sidewalls of the insulating layer 240, and a conductive via 260 formed in the space surrounded by the liner 250. The insulating layer 240 may be oxide or nitride. The liner 250 may be formed of any one of Ru, Ta, TaN, Ti, TiN, TaSiN, TiSiN, TiW and WN or any combination thereof, or other materials. The conductive via may be made of metals, such as at least one of Al, Cu, or W.

Preferably, the diffusion trapping region 600 is formed by self-aligning the outer periphery of the through-Si-via. The diffusion trapping region 600 comprises ions of any one or more of Ar, Xe, Ge, and P. The depth of the ion implantation is in the range of about 10-1000 nm, and the dose of the ion implantation is in the range of about $10^{13}$-$10^{16}$/cm$^2$.

The diffusion trapping region 600 may well absorb metal ions diffusing from the through-Si-via, the interconnection structure, and other structures, to avoid these ions from diffusing into other parts of the integrated circuit and causing negative effect of the performance or even failure to the device.

Figure 10:
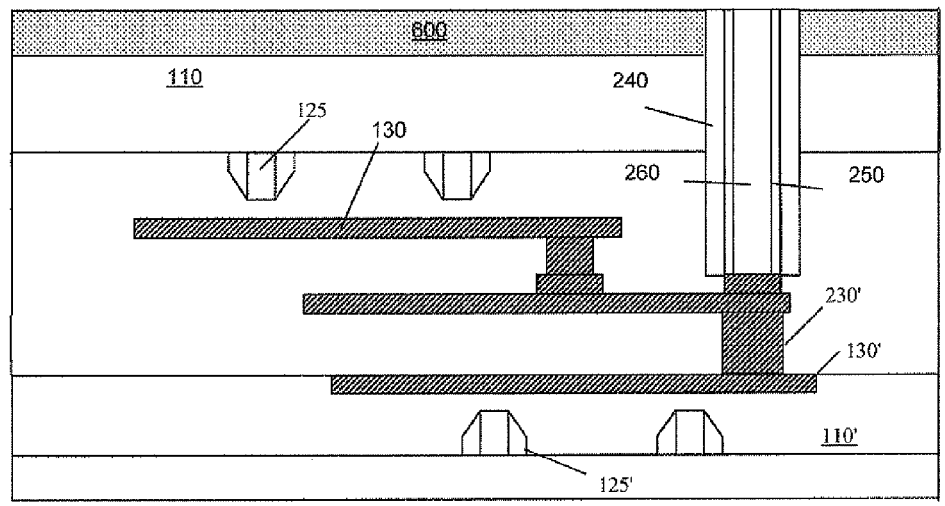

FIG. 10 shows a schematic view of the connection between the semiconductor wafer 100 of the 3D integrated circuit with other semiconductor 100'. As shown in FIG. 10, the semiconductor 100 is flipped over and provided a via 230'. The via 230' is connected with a BEOL structure 130' of a semiconductor device 125' on the semiconductor wafer 100'. The semiconductor device 125' may be a MOSFET. The semiconductor device 125', the BEOL structure 130', and the 230' may be manufactured in a similar way as the semiconductor wafer 100.

As such, the semiconductor wafer 100 is connected with the via 230' by means of the exposed conductive via 260 of the through-Si-via, and therefore the through-Si-via of the semiconductor wafer 100 is connected with the semiconductor wafer 100'. That is, the semiconductor wafer 100 and the semiconductor wafer 100' are connected in a bottom-to-top manner to obtain the 3D integrated circuit in a multi-wafer stack structure. Particularly, the diffusion trapping layer 600 effectively prevent metal ions from diffusing into the semiconductor devices 125 and 125' in the high-temperature bonding process.

In an embodiment of the present invention, the semiconductor wafer 100' may also have a diffusion trapping layer, such that when the bottom of the semiconductor wafer 100' is bonded with other wafers or external circuits forming the 3D integrated circuit, the internally disposed diffusion trapping layer may prevent metal ions of corresponding through-Si-vias or other structures from diffusing into transistor structures such as MOSFETs.

Those skilled in the art will understand that the method for manufacturing the diffusion trapping layer according to the present invention may be applied to other integrated circuit structures comprising through-Si-vias, which are not limited to the structures exemplified by the specific embodiments. Further, the process steps in the description are all exemplary rather than having a limitation intention. Those process steps may be replaced by other equivalent steps known in the art.

The above description is only for explaining the embodiments of the present invention, and does not intend to limit the scope of the present invention. Those skilled in the art will understand that the scope of the present invention will be defined by the accompanying claims. Any modifications or local substitutions that do not depart from the spirit and principle of the present invention will fall within the scope of the invention.

What is claimed is:

1. A three-dimensional integrated circuit structure, comprising:
   a semiconductor substrate;
   at least one semiconductor device formed on the upper surface of the semiconductor substrate;
   a through-Si-via extending through the semiconductor substrate, and comprising a conductive via and an insulating layer covering sidewalls of the conductive via;
   an interconnection structure connecting the at least one semiconductor device and the through-Si-via; and
   a diffusion trapping region formed on the lower surface of the semiconductor substrate and surrounding the through-Si-via.

2. The structure of claim 1, wherein the diffusion trapping region comprises any one or more ions of Ar, Xe, Ge, and P.

3. The structure of claim 1, wherein an implantation depth in the diffusion trapping region is in the range of about 10-1000 nm.

4. The structure of claim 1, wherein an implantation dose of ions in the diffusion trapping region is in the range of about $10^{13}$-$10^{16}$/cm$^2$.

5. The structure of claim 1, wherein the diffusion trapping region is a trapping region for metal ions.

6. The structure of claim 1, wherein the diffusion trapping region is formed at the lower surface of the semiconductor substrate by self-aligning the outer periphery of the through-Si-via.

7. A manufacturing method of a 3D integrated circuit, comprising:
   providing a semiconductor substrate with at least one semiconductor device formed on an upper surface of the semiconductor substrate;
   forming a through-Si-via in the semiconductor substrate, wherein the through-Si-via comprises a conductive via and an insulating layer covering sidewalls of the conductive via;
   forming an interconnection structure connecting the at least one semiconductor device and the through-Si-via;
   selectively etching a lower surface of the semiconductor substrate to stop at the insulating layer of the through-Si-via;
   forming a diffusion trapping region on the etched lower surface; and
   removing a part of the through-Si-via higher than the lower surface.

8. The method of claim 7, further comprising depositing a protection layer on the lower surface after forming the diffusion trapping region, and selectively removing the protection layer at the same time when removing the part of the through-Si-via higher than the lower surface.

9. The method of claim 7, wherein forming the diffusion trapping region on the lower surface comprises forming the diffusion trapping region by self-aligning the outer periphery of the through-Si-via.

10. The method of claim 7, wherein forming the diffusion trapping region comprises implanting ions into the lower surface, and the implanted ions comprise any one or more of Ar, Xe, Ge, and P.

11. The method of claim 10, wherein the depth for the ions implantation is controlled to be in the range of about 10-1000 nm.

12. The method of claim 10, wherein the implantation dose of the ions is in the range of about $10^{13}$-$10^{16}$/cm$^2$.

13. The method of claim 7, further comprises the lower surface of the semiconductor substrate being grinded to be thinned before selectively etching the lower surface.

14. The method of claim 7, wherein the diffusion trapping region is a trapping region for metal ions.

15. The method of claim 8, wherein the diffusion trapping region is a trapping region for metal ions.

16. The method of claim 9, wherein the diffusion trapping region is a trapping region for metal ions.

17. The method of claim 10, wherein the diffusion trapping region is a trapping region for metal ions.

18. The structure of claim 2, wherein the diffusion trapping region is formed at the lower surface of the semiconductor substrate by self-aligning the outer periphery of the through-Si-via.

19. The structure of claim 3, wherein the diffusion trapping region is formed at the lower surface of the semiconductor substrate by self-aligning the outer periphery of the through-Si-via.

20. The structure of claim 4, wherein the diffusion trapping region is formed at the lower surface of the semiconductor substrate by self-aligning the outer periphery of the through-Si-via.

* * * * *